(12) United States Patent
Ewert et al.

(10) Patent No.: US 6,469,487 B2
(45) Date of Patent: Oct. 22, 2002

(54) SOLAR-POWERED REFRIGERATION SYSTEM

(75) Inventors: Michael K. Ewert, Seabrook, TX (US); David J. Bergeron, III, League City, TX (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/838,679

(22) Filed: Apr. 19, 2001

(65) Prior Publication Data

US 2002/0023450 A1 Feb. 28, 2002

Related U.S. Application Data

(62) Division of application No. 09/337,208, filed on Jun. 3, 1999, now Pat. No. 6,253,563.

(51) Int. Cl.$^7$ ................................................ F25B 27/00
(52) U.S. Cl. ..................... 323/906; 62/228.4; 62/230; 62/235.1
(58) Field of Search ........................... 62/235.1, 228.4, 62/230, 228.1; 323/906

(56) References Cited

U.S. PATENT DOCUMENTS

| | | | | |
|---|---|---|---|---|
| 4,620,140 A | * | 10/1986 | Chonan | ................... 323/906 X |
| 4,928,493 A | * | 5/1990 | Gilbertson et al. | ............ 62/185 |
| 5,375,429 A | * | 12/1994 | Tokizaki et al. | ............ 62/235.1 |
| 5,501,083 A | * | 3/1996 | Kim | ....................... 62/235.1 X |
| 5,560,218 A | * | 10/1996 | Jang | ....................... 62/235.1 X |
| 5,923,100 A | * | 7/1999 | Lukens et al. | ........... 323/906 X |

\* cited by examiner

Primary Examiner—Harry B. Tanner
(74) Attorney, Agent, or Firm—James M. Cate

(57) ABSTRACT

A solar powered vapor compression refrigeration system is made practicable with thermal storage and novel control techniques. In one embodiment, the refrigeration system includes a photovoltaic panel, a variable speed compressor, an insulated enclosure, and a thermal reservoir. The photovoltaic (PV) panel converts sunlight into DC (direct current) electrical power. The DC electrical power drives a compressor that circulates refrigerant through a vapor compression refrigeration loop to extract heat from the insulated enclosure. The thermal reservoir is situated inside the insulated enclosure and includes a phase change material. As heat is extracted from the insulated enclosure, the phase change material is frozen, and thereafter is able to act as a heat sink to maintain the temperature of the insulated enclosure in the absence of sunlight. The conversion of solar power into stored thermal energy is optimized by a compressor control method that effectively maximizes the compressor's usage of available energy. A capacitor is provided to smooth the power voltage and to provide additional current during compressor start-up. A controller monitors the rate of change of the smoothed power voltage to determine if the compressor is operating below or above the available power maximum, and adjusts the compressor speed accordingly. In this manner, the compressor operation is adjusted to convert substantially all available solar power into stored thermal energy.

14 Claims, 4 Drawing Sheets

SOLAR-POWERED REFRIGERATION SYSTEM

This application is a division, of application Ser. No. 09/337,208, filed Jun. 3, 1999 now U.S. Pat. No. 6,253,563.

ORIGIN OF THE INVENTION

The invention described herein was made in the performance of work under a NASA contract and is subject to Public Law 96-517 (35 U.S.C. §200 et seq.). The contractor has not elected to retain title to the invention.

BACKGROUND OF THE INVENTION

1. Field of the Invention

This invention relates generally to solar power control systems, and in particular, to an efficient system and method for applying solar-generated power to refrigeration.

2. Description of the Related Art

Two billion people live without electricity. They represent a market for various solar powered systems such as stand-alone power systems and small capacity solar refrigerators. Efforts have been made to develop stand-alone photovoltaic (PV) power systems that provide lighting and power for small devices such as radios and small televisions. For example, such systems may include a solar panel, a battery, and a low wattage fluorescent light. Solar refrigerators, however, represent a bigger challenge.

Previous attempts to produce a marketable solar refrigerator have been largely unsuccessful. For example, consider the following patents:

In U.S. Pat. No. 4,126,014, Thomas Kay discloses an absorption refrigeration system powered by a heated fluid from a solar panel.

In U.S. Pat. No. 5,501,083, Tae Kim discloses an AC-powered air conditioner having a solar panel for backup electrical power.

In U.S. Pat. No. 5,497,629, Alexander Rafalovich discloses the use of solar power in an air conditioning system to pump heat from an indoor space to a thermal store.

In U.S. Pat. No. 5,685,152, Jeffrey Sterling discloses using a heated medium from solar collectors to produce a cold thermal store and mechanical energy to pump heat from an indoor space to the cold thermal store.

Kay's refrigeration system provides no means to maintain refrigerator operation in the absence of sunlight (e.g. at nighttime or on overcast days). As the air conditioning systems are largely unsuited for even small capacity refrigerators or freezers, no attempt has been made to scale these systems to produce a commercializable solar refrigerator.

Accordingly, it is desirable to provide an efficient, inexpensive, commercializable small capacity solar refrigerator which can operate for several days in the absence of sunlight. As batteries are often expensive and require regular maintenance, it would further be desirable to provide such a solar refrigerator which does not require batteries.

SUMMARY OF THE INVENTION

A solar powered vapor compression refrigeration system is made practicable with thermal storage and novel control techniques. In one embodiment, the refrigeration system includes a photovoltaic panel, a capacitor, a compressor, an insulated enclosure, and a thermal reservoir. The photovoltaic (PV) panel converts sunlight into DC (direct current) electrical power, some of which is stored in the capacitor. The capacitor provides additional current during compressor start-up, and thereafter acts to smooth out variations in the power voltage. The power from the PV panel and capacitor drives the compressor to circulate refrigerant through a vapor compression refrigeration loop, thereby extracting heat from the insulated enclosure. The thermal reservoir is situated inside the insulated enclosure and includes a phase change material. As heat is extracted from the insulated enclosure, the phase change material is frozen. Thereafter the thermal reservoir is able to act as a heat sink to maintain the temperature of the insulated enclosure for an extended period in the absence of sunlight.

This conversion of solar power into stored thermal energy is optimized by a compressor control method that effectively maximizes the compressor's usage of available energy. A controller monitors the rate of change of the smoothed power voltage to determine if the compressor is operating below or above the maximum available power, and adjusts the compressor speed accordingly. In this manner, the compressor operation is continuously adjusted to convert substantially all available solar power into stored thermal energy.

BRIEF DESCRIPTION OF THE DRAWINGS

A better understanding of the present invention can be obtained when the following detailed description of preferred embodiments is considered in conjunction with the following drawings, in which.

Figure 1:
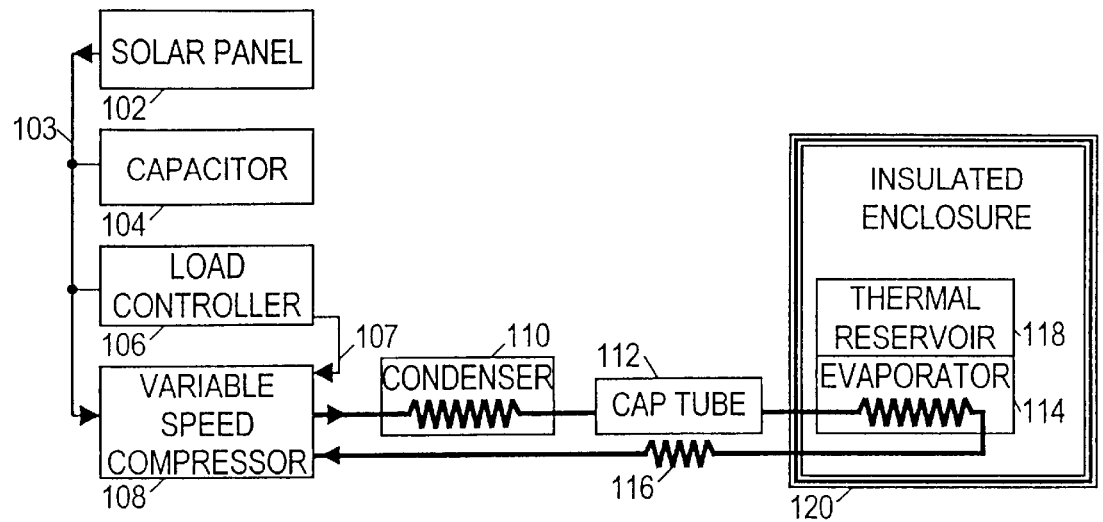
FIG. 1 is a block diagram of a first solar refrigeration system embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the figures, FIG. 1 shows a first embodiment of a solar refrigeration system which includes a solar panel 102 connected to a power bus 103. Although a wide variety of solar panel types and styles may be employed, one suitable example is a 12 volt nominal PV panel that is capable of a peak power output of approximately 120 watts at approximately 15 volts under full solar insolation.

A capacitor 104 is connected to power bus 103 in parallel with solar panel 102. Capacitor 104 operates to provide temporary storage of electrical charge in order to smooth any voltage variations on power bus 103 and to provide extra current during demand periods. The voltage variations may be caused by a variety of sources including changes in light intensity on the solar panel and changes in the electrical load driven by the solar panel 102. The capacitor 104 may be varied in size and type, but a preferred example is a 0.2 Farad electrolytic capacitor.

A variable speed compressor 108 with a load controller 106 is directly coupled to the solar panel 102 by power bus 103. In this context, "directly coupled" is defined to mean that no power converters are provided between the compressor 108 and solar panel 102. Although other embodiments are also contemplated, this embodiment advantageously exhibits relatively high efficiency due to the direct powering of the compressor 108 by a PV panel. It is noted that systems which use batteries typically force the solar panel to operate below its peak power point to match the battery charging voltage. Powering the compressor directly from the solar panel allows the solar panel to be operated at the maximum power point.

The variable speed compressor 108 is preferably a direct current compressor such as a Danfoss® BD35F direct current compressor with refrigerant 134a. Persons of skill in the art will recognize that other suitable compressors and refrigerants can be employed. The BD35F includes a "brushless" DC (direct current) motor in that provides permanent magnets on the rotor. Electronics in the BD35F switch the DC input to provide a 3-phase input to fixed coils that drive the rotor. The electronics improve the motor's efficiency by sensing the back-EMF in the coils to determine the rotor position. This compressor implementation is believed to exhibit efficiency and longevity advantages over typical DC compressors. As discussed in further detail below, load controller 106 senses the voltage on power bus 103 and regulates the speed of compressor 108 in response to variations in this voltage.

Compressor 108 circulates refrigerant through a vapor compression refrigeration loop that preferably includes a first heat exchanger (a.k.a. a condenser) 110, a capillary tube 112, a second heat exchanger (a.k.a an evaporator) 114 internal to an insulated enclosure 120, and a third heat exchanger (sometimes referred to as SLLL HX, or the suction line/liquid line heat exchanger) 116 associated with the capillary tube 112. As refrigerant is circulated through the loop, it is compressed by compressor 108, cooled to a liquid state by ambient air in condenser 110, flash-cooled by heat exchanger 116 in capillary tube 112, evaporated to a gaseous state in evaporator 114, warmed by heat exchanger 116, and recompressed and re-circulated by compressor 108. This circulation results in a net transfer of heat from the evaporator 114 to the condenser 110, thereby cooling the interior of the insulated enclosure 120 by heating ambient air. One of skill in the art will readily recognize that this refrigerant loop may be constructed in various suitable manners, and that other refrigerant loops may also be employed to achieve a net transfer of heat energy away from the insulated enclosure 120 without departing from the scope of the invention. For example, one specific alternate implementation uses an expansion valve in place of the capillary tube 112.

Similarly, many types of insulated enclosures are well known and may be employed, but a preferred construction for the insulated enclosure 120 uses fiberglass-reinforced plastic shells for the cabinet with vacuum panels between the inner and outer shells for insulation. A bezel interface is preferably provided between the cabinet and the door to minimize thermal conductance and convection through the seal. With this preferred construction, a cabinet having a composite R value (thermal resistance in units of hr. $ft_2$. ° F./BTU) of 26 has been achieved. (Most conventional refrigerators have a composite R value of 5.)

Referring still to FIG. 1, the load controller 106 senses the voltage on power bus 103 and provides a speed control signal 107 to variable speed compressor 108. By controlling the compressor speed, the load controller 106 effectively maximizes the power extracted from the solar panel. It inexpensively implements an advantageous optimization method as described in further detail below. While it can take various forms, the load controller 106 is preferably implemented in the form of a microcontroller that implements a software algorithm. The microcontroller may also be designed to perform other system functions such as: monitoring internal temperature of the insulated enclosure, monitoring the compressor for error conditions, and initiating compressor start-ups and shut-downs in a manner designed to extend the life of the compressor. In alternate embodiments, the load controller 106 may also control power source switching to access alternate power sources, if available and when necessary, or to provide redundancy (in the case of multiple solar panels).

A thermal reservoir 118 is preferably provided in the insulated enclosure 120. Thermal reservoir 118 preferably comprises a phase-change material that has a phase-change temperature at or slightly below the target interior temperature for the insulated enclosure. Particularly desirable phase-change materials are those having a solid-liquid phase change with a high heat of fusion, and which are inexpensive and relatively non-toxic. Water and water solutions are examples of suitable phase change materials. A water solution of approximately 3–5% propylene glycol may be particularly desirable, as it exhibits a reduced tendency to rupture closed containers when freezing. The size and phase change material of the thermal reservoir is preferably chosen to maintain the target interior temperature for several days in the absence of solar power (or at least 36 hours). One of skill in the art will recognize that thermal reservoir 118 may be implemented in a variety of suitable configurations.

In the embodiment of FIG. 1, the thermal reservoir 118 is contemplated as being adjacent to evaporator 114, and/or as being a part of evaporator 114. As refrigerant circulates through the evaporator 114 to cool the interior of the insulated enclosure 120, a direct transfer of heat energy occurs to evaporator 114 from thermal reservoir 118 to cool the thermal reservoir and induce a phase change of the phase-change material. In other words, if the phase-change material is water, the flow of refrigerant through the evaporator cools and freezes the water.

In operation, the solar panel 102 delivers power to power bus 103 during the day when the sun is shining. The load controller 106 runs the compressor 108 at a speed that maximizes the power extracted from the solar panel. The compressor 108 circulates refrigerant through a refrigerant loop to cool the insulated enclosure and to cool and induce a phase change of the material in the thermal reservoir. At night and during adverse weather conditions, no power is delivered to the power bus 103, and the compressor 108 is inactive. The temperature in the insulated enclosure is maintained by the thawing of the material in the thermal reservoir. Advantageously, no fluid circulation or active heat pumping is required to maintain the enclosure temperature during these inactive time periods.

Figure 2:
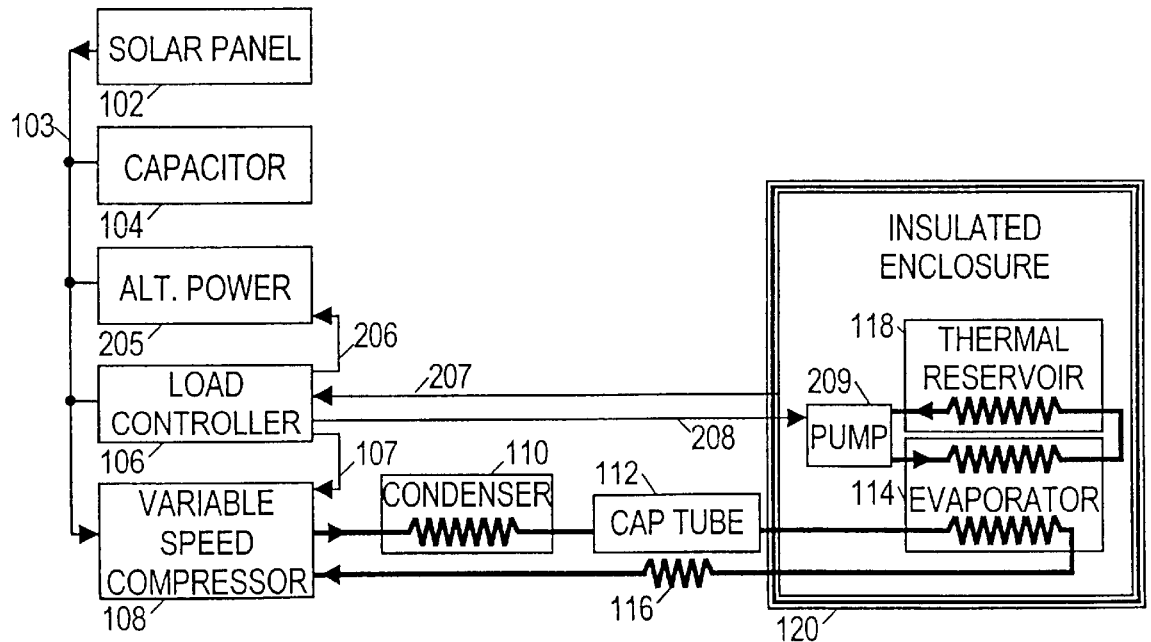
FIG. 2 is a block diagram of a second solar refrigeration system embodiment.

Referring now to FIG. 2, a second solar refrigeration system embodiment is shown. In this embodiment, an alternate power source 205 is coupled to power bus 103. The alternate power source 205 may take many forms including, e.g. a supplemental battery, a fuel cell, a generator, or an AC/DC converter connected to a commercial AC power grid. The load controller 106 turns the alternate power source 205 on or off by means of an enable signal 206. The load controller 106 preferably minimizes the use of alternate power source 206 to the greatest extent possible, using it only when solar power is unavailable and the temperature of the insulated enclosure exceeds a predetermined threshold. The load controller 106 monitors the interior temperature of insulated enclosure 120 by means of a temperature signal 207 from a temperature sensor (not shown) in insulated enclosure 120.

The solar refrigeration system embodiment of FIG. 2 also employs an alternate configuration for the evaporator 114 and thermal reservoir 118. In this configuration, the refrigerant passing through evaporator 114 cools a second fluid that is pumped through the evaporator 114 by a pump 209. Many fluids may be used, but currently a propylene glycol and water mixture is preferred. The cooled second fluid is then circulated through a heat exchanger in the thermal reservoir 118 to cool and induce a phase change in the phase change material. The load controller 106 may be configured to turn pump 209 on and off by means of a signal 208. Pump 209 is preferably activated only when compressor 108 is operating. A fan may be provided to improve air circulation, and may also be controlled by signal 208.

In one particular implementation of the alternate configuration shown by FIG. 2, the cooling of the insulated enclosure 120 is accomplished primarily by the thermal reservoir 118 and the heat exchanger therein. This implementation may prove advantageous relative to the configuration shown in FIG. 1 for several reasons. A first feature of this implementation is that the refrigerant volume is reduced, which may provide reduced cost and increased system longevity. A second feature of this implementation is that thermal leakage to the interior of the insulated enclosure during and after compressor shut-down is reduced. A third feature is that mechanical design of the thermal reservoir may be simplified due to a larger and more favorably distributed heat exchange area with the phase change material. It is noted that the solar refrigeration system embodiment of FIG. 1 may be modified to use this thermal reservoir configuration.

The load controller 106 may be designed to monitor the temperature of the insulated enclosure and respond to temperature excursions above or below predetermined thresholds. As mentioned previously, the load controller 106 may activate alternate power source 205 in response to a detected temperature above an upper temperature limit. Also, the load controller 106 may halt the variable speed compressor 108 in response to a detected temperature below a lower temperature limit. Once the temperature returns to the desired range, the load controller 106 may then resume normal solar-powered operation. One of skill in the art will recognize the desirability of providing some hysteresis in any such temperature regulation strategy. It is noted that the upper temperature limit is preferably slightly above the phase change temperature, and the lower temperature limit is preferably slightly below the phase change temperature.

Figure 3:
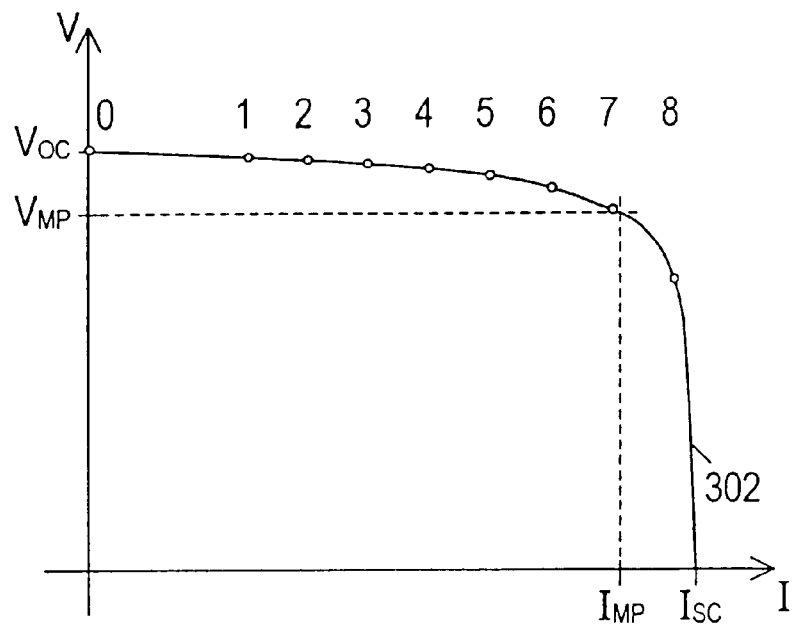
FIG. 3 is a graph of an exemplary I–V curve for a photovoltaic panel.
Figure 4:
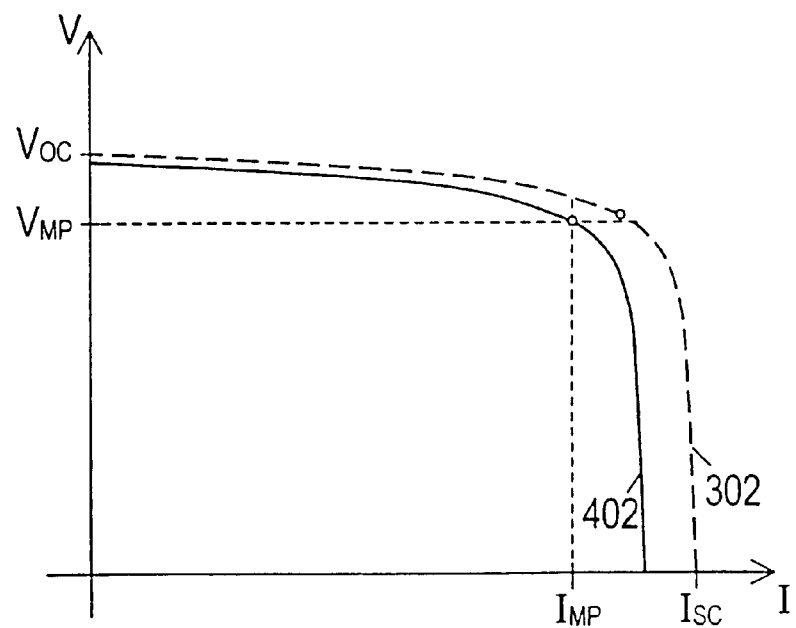
FIG. 4 is a graph of an exemplary I–V curve for a photovoltaic panel in reduced light.

As previously mentioned, load controller 106 operates to maximize the power drawn from the solar panel 102. Various methods which may be implemented by the load controller are now described with reference to FIGS. 3 and 4. FIG. 3 shows an I–V curve 302 representing the voltage V provided by solar panel 102 as a function of current I drawn from the solar panel, assuming maximum insolation (sunlight intensity). The voltage varies from $V_{OC}$ when no current is drawn to 0 when the short circuit current $I_{SC}$ is drawn. A typical example of an open circuit voltage $V_{OC}$ for a nominal 12 volt panel is 20 volts, and a typical example of a short circuit current is 8 amperes. On the curve between these two points is a maximum power point $(I_{MP}, V_{MP})$ where the maximum power is extracted from the solar panel. This point occurs where the slope of the curve is $dV/dI=-V/I$.

The load controller 106 preferably locates this maximum power point by an iterative search process. At an initial time t=0, the compressor 108 is not running, and no current is drawn. The load controller determines that a sufficient start-up voltage exists and starts the compressor at a minimum startup speed. Note that the current drawn by the compressor increases as the speed of the compressor increases. At a subsequent time t=1, the compressor is drawing a current and the voltage provided by the solar panel has been slightly reduced. The load controller 106 then begins gradually increasing the speed of the compressor 108, detecting the power bus voltage at regular intervals and adjusting the speed of the compressor in response to some criterion based on the detected voltage. The time progression of operating points has been exaggerated for illustration. In a preferred embodiment, the increments in speed are digital and are much smaller, so that 255 or more operating points on the curve are possible.

Various adjustment criteria may be used. For example, referring momentarily to FIG. 4, a second I–V curve 402 is shown for reduced insolation. The maximum power point on curve 402 has shifted relative to the maximum power point on curve 302. It is noted that while the current $I_{MP}$ at the maximum power point is particularly sensitive to the amount of insolation, the voltage $V_{MP}$ at the maximum power point is relatively insensitive to the amount of insolation. Consequently, the load controller 106 may increase or decrease the compressor speed as needed to maintain the power bus voltage close to a predetermined voltage target, e.g. the maximum power voltage for full solar insolation.

While simple, this criterion is suboptimal since the maximum power voltage varies with temperature, and in any case, this criterion does not provide for full power extraction during reduced insolation. Referring again to FIG. 3, it is noted that at all operating point voltages on curve 302 above the maximum power point voltage, the power provided by the solar panel increases as the current increases, whereas for all operating point voltages on the curve below the maximum power point voltage, the power provided by the solar panel DECREASES as the current increases. When this observation is combined with the observation that the power required by the compressor always increases as the speed increases, an improved control method can be developed for the load controller 106.

Referring simultaneously to FIGS. 1 and 3, it is noted that when the compressor 108 is run at a speed requiring less power than the solar panel 102 can provide, an increase in compressor speed will result in a matching increase in power extracted from the solar panel. Due to the capacitor 104, the power bus voltage will decrease smoothly and stabilize. In other words, the magnitude of the time derivative of the voltage decreases as a function of time. When the compressor 108 is run at a speed requiring more power than the solar panel 102 can provide, the charge on capacitor 104 provides the extra power required. Since only a limited amount of charge exists on capacitor 104, the capacitor 104 is increasingly depleted as time goes on, and the compressor attempts to draw more current from solar panel 102. This in turn causes the solar panel to provide less power as the voltage drops, causing further depletion of the capacitor and even more current draw from the solar panel 102. The power bus voltage rapidly decays, and in fact, the rate of voltage decay increases as a function of time. Expressed in calculus terms, when the second derivative of the voltage with respect to time is greater than or equal to zero, the system is operating on the curve above the maximum power point voltage. When the second derivative of the voltage with respect to time is less than zero, the system is operating on the curve below the maximum power point voltage.

Figure 5:
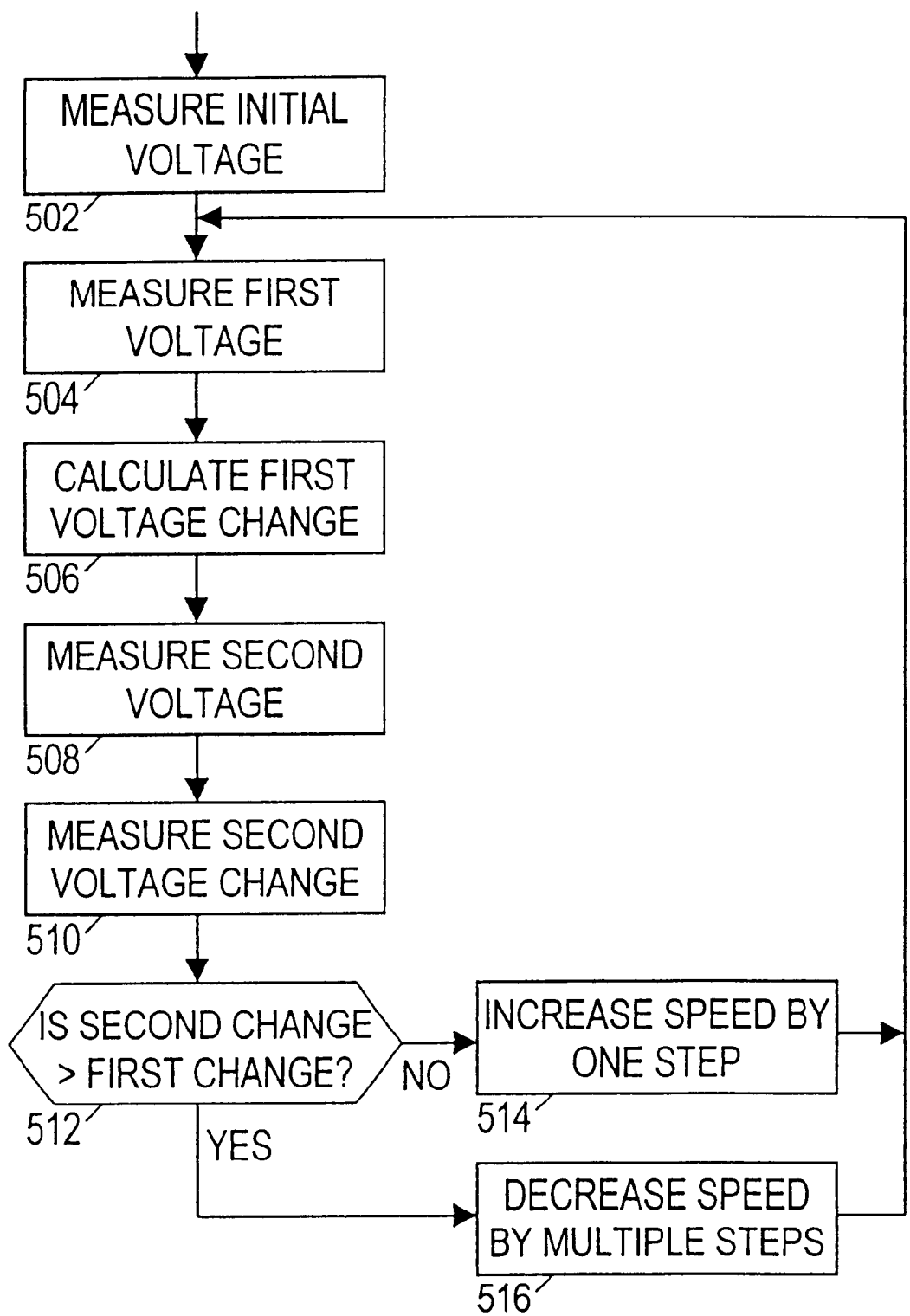
FIG. 5 is a flowchart of a first compressor speed control method.

FIG. 5 shows a first improved control method which may be implemented by load controller 106. After the load controller has started the compressor and allowed some small amount of time for the voltage on the power bus to settle into a steady state, the load controller begins sampling the voltage at regularly spaced time intervals. One of skill in the art will recognize that the sampling intervals may be allowed to vary if this is determined to be desirable, and appropriate adjustments can be made to the method. Additionally, the power bus voltage signal may be mildly conditioned to remove high frequency noise before being sampled by the load controller.

In step 502 an initial voltage sample is taken before the load controller enters a loop consisting of steps 504–516. For each iteration of the loop, two additional voltage samples are taken. In step 504, a first voltage sample is taken, and in step 506 a first change in the voltage is calculated by subtracting the previous voltage sample from the first voltage sample. In step 508, a second voltage sample is taken, and in step 510 a second voltage change is calculated by subtracting the first voltage sample from the second voltage sample.

In step 512, the two calculated voltage changes are compared. If the magnitude of the second voltage change is less than or equal to the magnitude of the first voltage change, then in step 514, the loop controller increments the speed of the compressor by one step. On the other hand, if the magnitude of the second voltage change is larger than the magnitude of the second voltage change, then in step 516, the loop controller decrements the speed of the compressor by two or more steps. While various implementations of decrement step 516 are contemplated, it is currently preferred to make the number of decrement steps a predetermined constant based on the system embodiment. It is further contemplated to make the increment step sizes adaptive in nature. The adaptation may be based on the size of the calculated first voltage change, so that smaller voltage changes result in smaller step sizes. In this marner, the load controller may more quickly and accurately locate the maximum power point. The nature of the adaptation may be changed after the first time the speed is decremented to provide for a smaller range of variation about the optimal operating point. For example, the step size may become based proportionally on the size of the second calculated voltage change, so that larger voltage changes result in larger step sizes.

Figure 6:
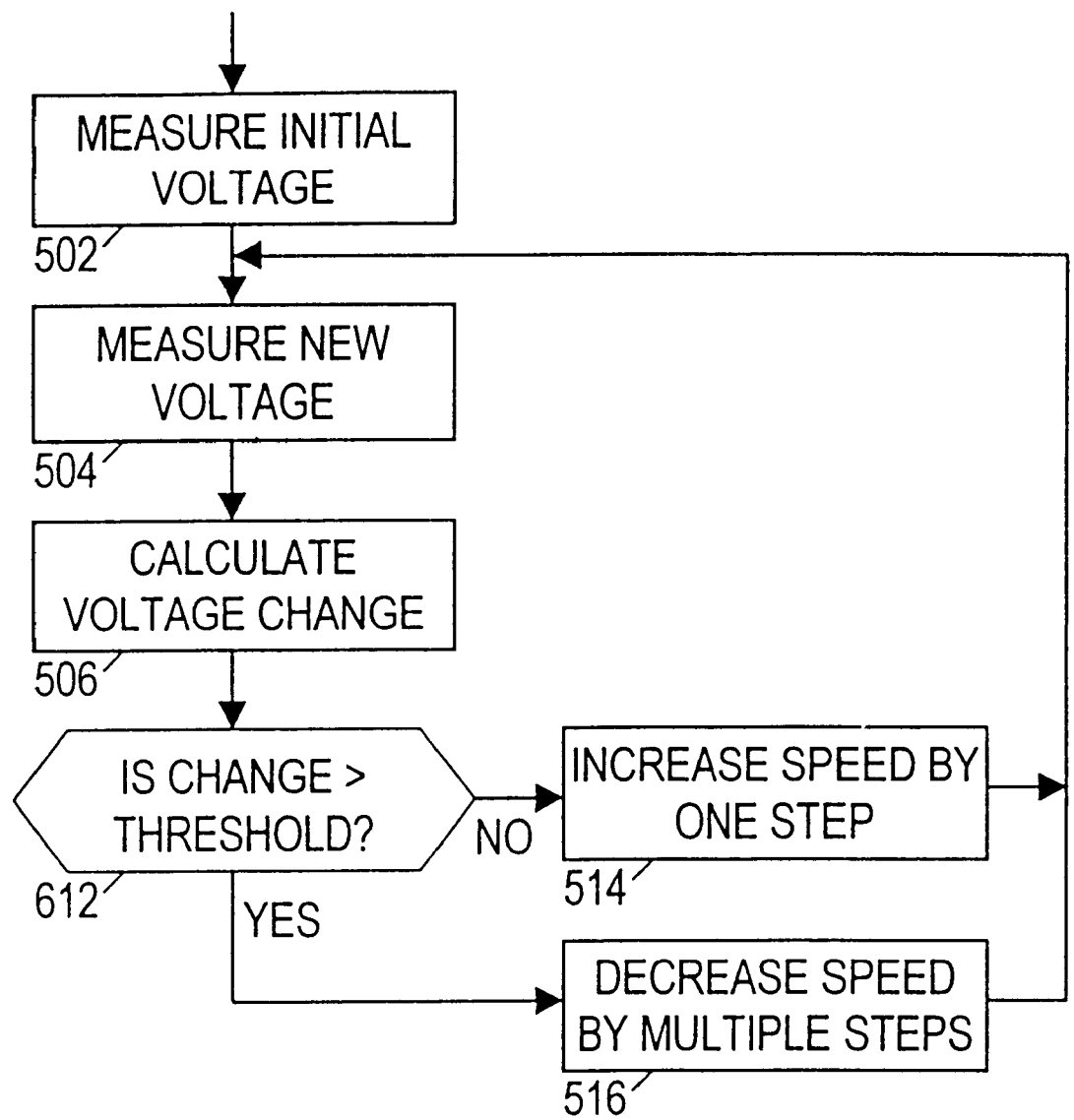
FIG. 6 is a flowchart of a second compressor speed control method.

FIG. 6 shows a second improved control method which may be implemented by load controller 106. When the system is operating on the portion of the solar panel curve below the maximum power point, the calculated voltage changes continually grow if the compressor speed is not adjusted. Hence the method of FIG. 5 may be simplified by eliminating steps 508 and 510, and replacing step 512 with step 612, in which the calculated voltage change is compared with a predetermined threshold. No matter where the system is operating on the lower part of the curve, eventually the calculated volt age change will exceed the threshold, and the compressor speed will be reduced accordingly. When the voltage change is less than the threshold, the system is assumed to be on the upper part of the curve, and the compressor speed is increased. The threshold is preferably adjusted to allow for only a small range of variation around the maximum power point.

It is noted that the disclosed refrigeration systems and power control methods may have many varied embodiments. For example, one refrigeration system embodiment may employ an insulated enclosure with divided compartments that are maintained at different temperatures such as might be suitable for storing fresh and frozen foods. Another embodiment may employ the structure and stored contents of the insulated enclosure as the thermal reservoir. This latter approach may prove particularly suitable for refrigeration systems that are configured to produce the stored contents, such as would be the case for an ice maker. Some embodiments may include alternate energy sources such as batteries, a generator, or a commercial power grid, the use of which is may be minimized by using the solar panel as much as possible. These embodiments could use a smaller thermal reservoir due to availability of an alternate power source to maintain the temperature. In some embodiments, the refrigeration system may be applied to cool poorly insulated enclosures that are often exposed to substantial amounts of sunlight. In this vein, one refrigeration embodiment is an air conditioning system for vehicles that cools the interior when the vehicle is exposed to the sun. Such a system may or may not include some form of phase change material as a thermal reservoir.

Numerous such variations and modifications will become apparent to those skilled in the art once the above disclosure is fully appreciated. It is intended that the following claims be interpreted to embrace all such variations and modifications.

What is claimed is:

1. A solar powered apparatus which comprises:

a variable speed motor;

a power source which converts light into electrical power having a DC voltage;

a power bus coupled to the power source and configured to provide electrical power at said DC voltage to the variable speed motor, and a controller coupled to the power bus to detect said DC voltage and coupled to the variable speed motor to provide a speed control signal, wherein the controller determines a time derivative of said DC voltage, wherein the controller increases the motor speed if the derivative of said DC voltage is above a predetermined threshold, and wherein the controller decreases the motor speed if the derivative of said DC voltage is below the predetermined threshold, and wherein the controller is further configured to adjust the speed control signal to maximize usage of the electrical power from the power source wherein the controller determines a second-order time derivative of said DC voltage, and wherein the controller increases the motor speed if the second-order derivative is above a predetermined threshold, and wherein the controller decreases the motor speed if the second-order derivative is below the predetermined threshold, wherein the controller is configured to adjust the speed control signal to maximize usage of the electrical power from the power source.

2. The solar powered apparatus of claim 1, wherein the variable speed motor turns a compressor.

3. The solar powered apparatus of claim 2, wherein the compressor is configured to circulate refrigerant through a vapor-compression refrigeration cycle to store thermal energy by inducing a phase change in a phase-change material included in a thermal reservoir.

4. The solar powered apparatus of claim 1, wherein the controller adjusts the load on the power bus by increasing the motor speed if the derivative of said DC voltage is above a predetermined threshold, and wherein the controller decreases the motor speed if the derivative of said DC voltage is below the predetermined threshold.

5. The solar powered apparatus of claim 1, further comprising a capacitor coupled in parallel with the power source.

6. A method for extracting maximum power from a power-limited, direct current (DC) power source having a capacitive characteristic, wherein the method comprises:

measuring a power voltage;

determining an unsigned rate of change for said power voltage;

incrementing a rate of power extraction from said power source if said unsigned rate of voltage change is less than a predetermined threshold; and decrementing a rate of power extraction from said power source if said unsigned rate of voltage change is greater than the predetermined threshold.

7. The method of claim 6, wherein incrementing the rate of power extraction includes adjusting a compressor speed upward, and wherein decrementing the rate of power extraction includes adjusting the compressor speed downward.

8. The method of claim 7, wherein decrements to the compressor speed are at least twice as large as increments to the compressor speed.

9. The method of claim 7, wherein the compressor speed is adjusted downward by an amount proportional to the unsigned rate of change.

10. A solar powered compressor control method which comprises:

acquiring samples of a power voltage;

determining a first unsigned rate of change for said power voltage;

determining a subsequent unsigned rate of change for said power voltage;

incrementing a compressor speed if said first unsigned rate of voltage change is greater than the subsequent unsigned rate of voltage change; and decrementing the compressor speed if said first unsigned rate of voltage change is less than the subsequent unsigned rate of voltage change; and decrementing the compressor speed if said first unsigned rate of change is less than the subsequent unsigned rate of change.

11. The method of claim 10, wherein decrements to the compressor speed are at least twice as large as increments in the compressor speed.

12. The method of claim 10, wherein the compressor speed is adjusted by an amount related to the subsequent unsigned rate of change.

13. A solar powered apparatus which comprises:

a variable speed motor;

a power source which converts light into electrical power having a DC voltage;

a power bus coupled to the power source and configured to provide electrical power at said DC voltage directly, without battery storage means, to the variable speed motor; and a controller coupled to the power bus to detect said DC voltage and coupled to the variable speed motor to provide a speed control signal, wherein the controller is configured to adjust the speed control signal to maximize usage of the electrical power from the power source in response to changes of voltage levels on said power bus.

14. A solar powered apparatus which comprises:

a variable speed motor;

a power source which converts light into electrical power having a DC voltage;

a power bus coupled to the power source and configured to provide electrical power at said DC voltage to the variable speed motor; and a controller coupled to the power bus to detect said DC voltage and coupled to the variable speed motor to provide a speed control signal, wherein the controller determines a time derivative of said DC voltage, wherein the controller increases the motor speed if the derivative of said DC voltage is above a predetermined threshold, and wherein the controller decreases the motor speed if the derivative of said DC voltage is below the predetermined threshold.

* * * * *